United States Patent
Philippe

(10) Patent No.: US 8,085,108 B2
(45) Date of Patent: Dec. 27, 2011

(54) DIGITAL POLAR RADIO FREQUENCY TRANSMITTING DEVICE WITH A RADIOFREQUENCY REFERENCE OSCILLATOR AND AN INTEGRATED CIRCUIT COMPRISING SUCH DEVICE

(75) Inventor: Pascal Philippe, Caen (FR)

(73) Assignee: ST-Ericsson SA, Plan-les-Ouates (CH)

( * ) Notice: Subject to any disclaimer, the term of this patent is extended or adjusted under 35 U.S.C. 154(b) by 42 days.

(21) Appl. No.: 12/441,524

(22) PCT Filed: Sep. 14, 2007

(86) PCT No.: PCT/IB2007/053717
§ 371 (c)(1),
(2), (4) Date: Jan. 14, 2010

(87) PCT Pub. No.: WO2008/035260
PCT Pub. Date: Mar. 27, 2008

(65) Prior Publication Data
US 2010/0111227 A1    May 6, 2010

(30) Foreign Application Priority Data

Sep. 18, 2006  (EP) .................... 06300957

(51) Int. Cl.
H03C 3/00    (2006.01)
H03C 3/38    (2006.01)
H04L 27/04   (2006.01)
H04L 27/20   (2006.01)
H04L 27/36   (2006.01)

(52) U.S. Cl. .......... 332/145; 375/300; 375/308
(58) Field of Classification Search .......... 332/144–146, 332/149, 151, 152; 375/300–302, 308
See application file for complete search history.

(56) References Cited

U.S. PATENT DOCUMENTS

| 6,160,856 | A | 12/2000 | Gershon | |
|---|---|---|---|---|
| 6,985,703 | B2 * | 1/2006 | Groe et al. | 455/108 |
| 2003/0016762 | A1 * | 1/2003 | Martin et al. | 375/308 |
| 2003/0152181 | A1 * | 8/2003 | Stengel et al. | 375/371 |
| 2006/0160499 | A1 | 7/2006 | Puma | |

FOREIGN PATENT DOCUMENTS

DE    10045761 A1    3/2002

OTHER PUBLICATIONS

PCT International Search Report, PCT/IB2007/053717, mailing date Feb. 29, 2008.

* cited by examiner

*Primary Examiner* — David Mis
(74) *Attorney, Agent, or Firm* — Howison & Arnott, L.L.P.

(57) ABSTRACT

A radiofrequency transmitting device delivers output signals having a chosen radiofrequency from input data split up into complementary phase data and amplitude data. This device includes a radiofrequency reference oscillator for outputting a reference signal having a fixed radiofrequency reference, and a digital phase modulator for synthesizing the chosen radiofrequency from the fixed radiofrequency reference and for phase modulating the reference signal with the phase data, in order to produce an output signal having the chosen radiofrequency.

19 Claims, 1 Drawing Sheet

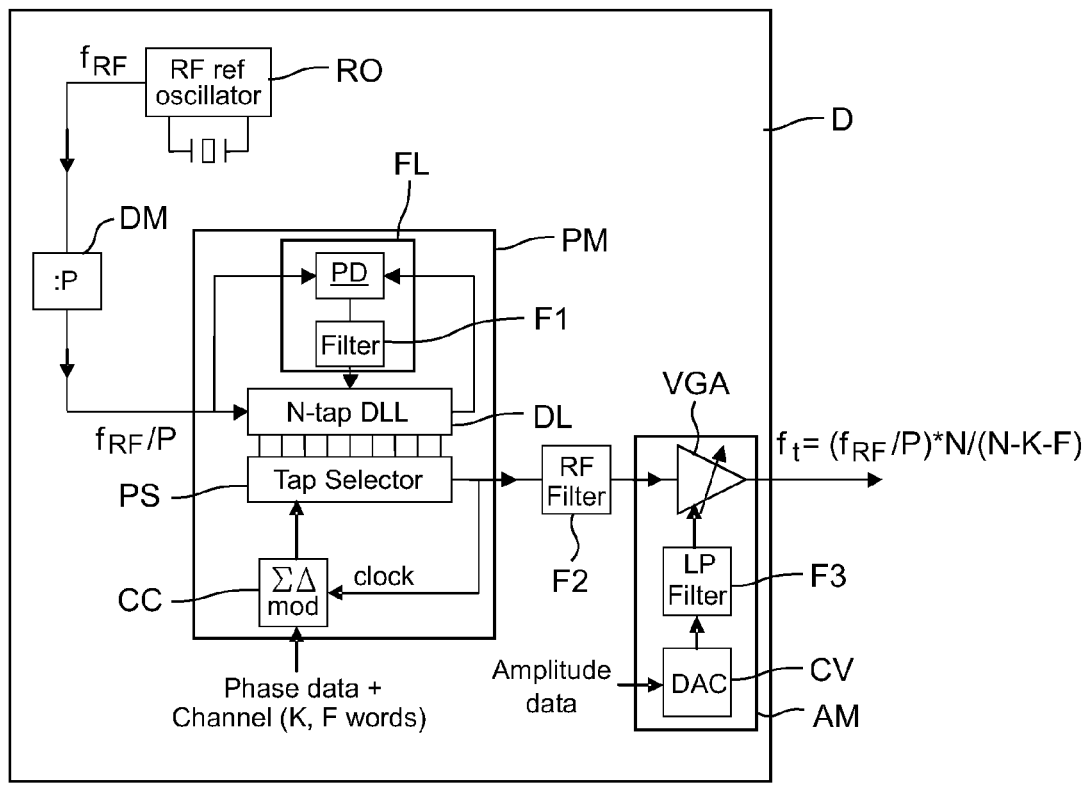

DIGITAL POLAR RADIO FREQUENCY TRANSMITTING DEVICE WITH A RADIOFREQUENCY REFERENCE OSCILLATOR AND AN INTEGRATED CIRCUIT COMPRISING SUCH DEVICE

CROSS-REFERENCE TO RELATED APPLICATIONS

The present application is a national filing in the U.S. Patent & Trademark Office of PCT/IB2007/053717 filed Sep. 14, 2007, and claims priority of European Patent Application No. 06300957.5 filed Sep. 6, 2006, both of which applications are incorporated herein in their entireties by this reference.

FIELD OF THE INVENTION

The present invention relates to a radiofrequency (RF) transmitting device such as the ones that are used into communication equipments in order to transmit/receive data/voice.

BACKGROUND OF THE INVENTION

Most existing RF transmitting devices perform a so-called direct frequency conversion from baseband to RF of the signals to transmit. Such a frequency conversion can be classically carried out by means of a single-sideband IQ RF mixer (in which input data used to modulate a carrier are decomposed (or split up) into in-phase (I) and quadrature (Q) data) or a polar device (in which input data used to modulate a carrier are decomposed (or split up) into phase data and amplitude data). Examples of digital polar RF transmitting devices are notably described in the patent documents US 2005/0116786, US 2005/011685, US 2005/0089117 and US 2005/0083085.

As it is known by the man skilled in the art, in both cases in order, the RF transmitting device must be capable of delivering an output signal with a variable radiofrequency, it has to comprise a RF voltage controlled oscillator (VCO) loop locked onto a reference signal having a low frequency, typically in the 10-40 MHz range and generally provided by a quartz oscillator, by means of a RF phase locked loop (or PLL).

Due to the presence of a phase locked loop, the known RF transmitting devices present several drawbacks. First of all, they have difficulties to cover a large frequency range, related to the difficulty to design a wide-band RF VCO. Moreover, they comprise a VCO which is a sensitive module and therefore is susceptible to be disturbed by the transmit RF signal itself and/or by other internal or external RF signals and/or by low frequency signals present on-chip. More, they comprise a phase locked loop which necessitates i) a loop filter that is difficult or expensive to integrate on a chip, and ii) two oscillators (a reference oscillator and a VCO). Still more, when their reference oscillator is a quartz oscillator, they cannot be fully integrated into the package of the transceiver integrated circuit (IC), because of the bulkiness of this type of oscillator.

SUMMARY OF THE INVENTION

So, the object of this invention is to overcome at least one of the above mentioned drawbacks.

For this purpose, it provides a RF transmitting device, intended for delivering output signals having a chosen radiofrequency from input data split up into phase data and amplitude data (possibly constant), and comprising:

a RF reference oscillator arranged for outputting a reference signal having a fixed radiofrequency reference, and a digital phase modulator arranged for synthesizing the chosen radiofrequency from the fixed radiofrequency reference and for phase modulating the reference signal with the phase data, in order to produce an output signal having the chosen radiofrequency.

The RF transmitting device according to the invention may include additional characteristics considered separately or combined, and notably:

its RF reference oscillator may comprise a RF resonator;
this RF resonator may be temperature compensated;
this RF resonator can be a Bulk Acoustic Wave (BAW) resonator or a Surface Acoustic Wave (SAW) resonator, for instance;

its RF reference oscillator outputs a reference signal having a fixed radiofrequency reference which may be equal to, or greater or lower than, the chosen radiofrequency;

it may further comprise a division means arranged for dividing the fixed radiofrequency reference of the reference signal by a chosen factor, in order to feed the digital phase modulator with a reference signal having a chosen divided fixed radiofrequency reference intended for synthesizing the chosen radiofrequency;

it may further comprise an amplitude modulator arranged for applying a chosen amplitude modulation, depending from the amplitude data (which represents partly the input data), to the output signal produced by the digital phase modulator;

this amplitude modulator may comprise i) a digital-to-analog convertor (DAC) arranged for delivering analog amplitude data from the amplitude data, ii) a low-pass filter arranged for filtering the analog amplitude data to deliver filtered analog amplitude data defining an analog control signal, and iii) a variable gain amplifier arranged for applying an amplitude modulation defined by the analog control signal to the output signal;

its digital phase modulator may comprise i) a Delay-Locked-Loop (DLL), comprising a cascade of N identical delay cells arranged for defining a chosen adjustable delay, ii) a feedback loop arranged for adjusting the chosen adjustable delay of the DLL to exactly one period of the phase data, in function of a control signal, iii) a phase selector arranged for selecting the output of a selected delay cell of the DLL in order to apply the adjustable delay corresponding to this selected delay cell to the reference signal, and then produce the output signal, and iv) a control circuit arranged for selecting the selected delay cell in function of a digital control word representative of the chosen radiofrequency to be synthesized and of a chosen type of phase modulation;

this feedback loop may comprise i) a phase detector arranged for comparing the phase of the reference signal with the phase of the signal outputted by the last delay cell of the DLL, in order to produce an error signal representative of the phase difference between the reference signal and the outputted signal, and ii) a low-pass filter arranged for integrating the produced error signals to generate the control signal;

its control circuit may be an accumulator or a digital delta-sigma modulator, for instance.

The invention also provides a communication equipment comprising a RF transmitting device such as the one above introduced.

Other features and advantages of the invention will become apparent on examining the detailed specifications hereafter and the appended drawing, in which the unique FIGURE schematically illustrates an example of embodiment of a RF transmitting device according to the invention comprised in an integrated circuit.

BRIEF DESCRIPTION OF THE DRAWINGS

The appended drawing may not only serve to complete the invention, but also to contribute to its definition, if need be.

DETAILED DESCRIPTION OF PREFERRED EMBODIMENTS

The invention aims at offering a RF transmitting device which only comprises a single oscillator with a low bulkiness allowing a full integration into the package of a communication integrated circuit (IC), such as a transceiver for instance, intended to be part of a communication equipment.

In the following description it will be considered that the RF transmitting device (D) equips a communication equipment, such as a mobile telephone. But, the device according to the invention is not limited to this type of communication equipment. It may be installed into any type of (tele)communication equipment, mobile (or portable or cellular) or not, requiring a RF transmitting device for delivering output signals having a chosen radiofrequency from input data that are split up into complementary phase data and amplitude data. So, it may be also installed into a personal digital assistant (PDA) or a computer, possibly of the portable type, for instance.

As illustrated in the unique FIGURE, a RF transmitting device D according to the invention comprises, in combination, at least a RF reference oscillator RO and a digital phase modulator PM.

The RF reference oscillator RO is intended for providing the device D with a reference signal which defines a carrier and whose frequency $f_{RF}$ is a fixed radiofrequency reference. The latter may be equal to, or greater than, or even lower than (at most a factor equal to 2), the radiofrequency $f_t$ chosen for transmitting the output signals.

One means here by "output signal" a carrier modulated with phase data and possibly with amplitude data. It is recalled that the (input) data which must be transmitted as output signals are split up in polar coordinates before feeding the RF transmitting device D. So, the RF transmitting device D receives phase data and amplitude data which define together the input data. One will notice that the amplitude data (defining the input data with the phase data) may be constant.

Typically the fixed radiofrequency reference $f_{RF}$ is greater than or equal to 2 GHz.

For instance, this RF reference oscillator RO comprises a Bulk Acoustic Wave (BAW) resonator or a Surface Acoustic Wave (SAW) resonator. Theses types of resonator have a high quality factor which allows building RF oscillators with the required spectral quality.

This RF reference oscillator RO can be temperature compensated to offer a high temperature stability. Typically a temperature coefficient of the order of 1 ppm/° K. can be obtained in the case of a BAW resonator. Preferably, the residual temperature drift of the RF reference oscillator RO can be corrected in order the reference signal (i.e. the carrier) could be used by the digital phase modulator PM. When this intrinsic temperature stability is not sufficient, it can be increased by means of a control loop, or by means of the modulator itself (for this purpose one can include a temperature correction into the digital word which is used to control it).

The digital phase modulator PM is intended for synthesizing the chosen radiofrequency $f_t$ at which the output signal must be transmitted, from the fixed radiofrequency reference of the reference signal, but also for phase modulating the carrier with the phase data which partly represents the data to transmit.

The digital phase modulator PM receives the reference signal (i.e. the carrier to modulate) and the phase data intended for phase modulating the carrier. As illustrated in the unique FIGURE, the RF transmitting device D may comprise a division module (or divider) DM for dividing the fixed radiofrequency reference $f_{RF}$ of the reference signal, outputted by the RF reference oscillator RO, by a chosen factor P, before this reference signal reaches the digital phase modulator PM. In this case, the digital phase modulator PM synthesizes the chosen radiofrequency $f_t$ with a reference signal having a fixed radiofrequency reference equal to $f_{RF}/P$.

In the non limiting example of embodiment illustrated in the unique FIGURE, the digital phase modulator PM comprises a Delay-Locked-Loop (DLL) DL, a feedback loop FL, a phase selector PS and a control circuit CC.

The Delay-Locked-Loop DL comprises a cascade of N identical delay cells which are intended for defining a fixed adjustable delay (typically equal to one period of the input data) from the fixed radiofrequency reference ($f_{RF}/P$) of the reference signal. So, a chosen adjustable delay can be defined from this fixed adjustable delay by selecting the output of one delay cell through a current or voltage command generated by the phase selector PS.

The feedback loop FL is intended for adjusting the adjustable delay of the Delay-Locked-Loop DL to exactly one period of the phase data, in function of a control signal.

As illustrated in the unique FIGURE, the feedback loop FL can comprise a phase detector PD, possibly of the digital type but not necessarily, and a filter F1.

The phase detector PD is connected to the input of the Delay-Locked-Loop DL to be fed with the reference signal and to the output of the last delay cell of the Delay-Locked-Loop DL to be fed with the signal it outputs and which is representative of the fixed delay introduced by the whole Delay-Locked-Loop DL. For instance, the phase detector PD compares the phase of the reference signal with the phase of the signal which is outputted by the last delay cell, in order to produce an error signal representative of their phase difference.

The filter F1 is preferably a low-pass filter which is intended for integrating the error signals, produced by the phase detector PD, in order to generate the control signal which allows to adjust the adjustable delay of the Delay-Locked-Loop DL to exactly one period of the phase data.

The phase selector PS is intended for selecting the output of one delay cell of the Delay-Locked-Loop DL in order to define a chosen adjustable delay for the carrier, and then produce a phase modulated carrier defining the output signal. This phase selector PS can be seen as a multiplexer which proceeds to the delay cell selection under control of the control circuit CC, and outputs the phase modulated carrier with the chosen synthesized radiofrequency $f_t$.

The control circuit CC is intended for selecting the selected delay cell in function of a digital control word which is representative in the same time of the chosen radiofrequency $f_t$ to be synthesized and of the type of the phase modulation which must be applied to the carrier. For instance, the control circuit CC is an accumulator or a digital delta-sigma modulator.

As mentioned before, the phase modulator PM performs the frequency translation and the phase modulation of the carrier.

The frequency translation is performed by rotation of the selected position of the phase selector PS along the Delay-Locked-Loop DL. More precisely, the selected position is systematically change by a circular permutation. For example, if the selected position is rotated backwards by K taps every cycle of the output signal, the frequency $f_{RF}/P$ is multiplied by a factor N/(N−K), where N is the number of taps (or delay cells) in the Delay-Locked-Loop DL and K is defined by the digital control word received by the control circuit CC. So, in this case the chosen radiofrequency $f_r$ of the output signal is equal to $[(f_{RF}/P)*N/(N-K)]$ (or $[(f_{RF}/P)*N/(N-K-F)]$ where F represents a fractional part—when the selector position is not systematically moved from K positions, but from K or K+1 positions according to a predetermined sequence, one has an integer part equal to K and a fractional part F which is equal to the probability that occurs a shift of K+1 position). Similarly, rotating onwards the selected position of the phase selector PS decreases the chosen radiofrequency $f_r$ of the output signal. It is also possible to keep the chosen radiofrequency $f_r$ of the output signal equal to the frequency $f_{RF}/P$.

It is also possible to modulate the amplitude of the phase shift from one cycle to another. This allows to get a complex phase trajectory such as the one associated to a combination of a frequency change and a phase modulation. This phase trajectory is accomplished by steps of Ti/N, where Ti is the period of the input signal (data). Because of this quantization of the phase, the phase modulator PM is a digital phase modulator PM with a quantization step of Ti/N.

As the phase trajectory is quantized by steps of Ti/N, the output signal may contain a quantization noise. The spectrum of this noise can be "shaped" by a proper design of the delta-sigma modulator CC which controls the phase selector PS, in order to minimize the spectral components of the noise in the vicinity of the carrier. By pushing the noise away from the carrier, it can be more easily rejected by a simple RF filter F2 located at the output of the digital phase modulator PM. In a variant, it is also possible to reduce the quantization noise by decreasing the quantization step (or unitary delay) Ti/N.

Thanks to the capability of the digital phase modulator PM to generate precise chosen radiofrequencies $f_r$ in fine steps (determined by the number of bits used in the delta-sigma modulator CC), it can be used to compensate the residual frequency drift of the RF reference oscillator RO with temperature, as mentioned before.

As illustrated in the unique FIGURE the digital phase modulator PM can be associated with an amplitude modulator AM in order to generate a combined amplitude and phase modulation. This is mandatory when the amplitude data (defining the input data with the phase data) vary in time. When these amplitude data are constant the modulation is said at "constant envelope".

This amplitude modulator AM may comprise (as illustrated) a digital-to-analog convertor (DAC) CV, a low-pass filter F3 and a variable gain amplifier VGA.

The digital-to-analog convertor CV is fed with the amplitude data, which represents partly the input data to transmit, and is arranged for converting them into analog amplitude data.

The low-pass filter F3 is fed with the analog amplitude data, outputted by the digital-to-analog convertor CV, and outputs filtered analog amplitude data which define analog control signals for the variable gain amplifier VGA.

The variable gain amplifier VGA is fed either with the phase modulated carrier produced by the digital phase modulator PM or with filtered phase modulated carrier outputted by the RF filter F2. It is intended for applying an amplitude modulation defined by the analog control signal (and therefore the amplitude data) to the (filtered) phase modulated carrier, in order to produce the output signal (i.e. a phase and amplitude modulated carrier).

The radiofrequency transmitting device D, according to the invention, may be an integrated circuit (IC) realized in advanced digital CMOS technology or in any advanced technology used in chip industry fabrication, and notably in BiCMOS. It might also be composed of several integrated circuits (ICs).

The RF resonator used in the RF reference oscillator RO, having a size which is much smaller than the one of a quartz resonator, it can be more easily integrated in the same package as a transceiver IC, thus offering the possibility of a true "System-in-Package".

The invention is not limited to the embodiments of radiofrequency transmitting device and communication equipment described above, only as examples, but it encompasses all alternative embodiments which may be considered by one skilled in the art within the scope of the claims hereafter.

The invention claimed is:

1. A radiofrequency transmitting device for delivering output signals having a chosen radiofrequency from input data split up into complementary phase data and amplitude data, comprising:
    a radiofrequency reference oscillator for outputting a reference signal having a fixed radiofrequency reference to said chosen radiofrequency; and
    a digital phase modulator adapted to synthesize said chosen radiofrequency from said fixed radiofrequency reference and adapted to phase modulate said reference signal using a number of N taps in a delay-locked-loop and adapted to move the reference signal a number K taps in the delay-locked-loop each cycle as defined by the phase data, the phase data being provided in order to produce an output signal having said chosen radiofrequency and phase modulation.

2. A radiofrequency transmitting device according to claim 1, wherein said radiofrequency reference oscillator comprises a radiofrequency resonator.

3. A radiofrequency transmitting device according to claim 2, wherein said radiofrequency resonator is temperature compensated.

4. A radiofrequency transmitting device according to claim 2, wherein said radiofrequency resonator comprises a Bulk Acoustic Wave resonator or a Surface Acoustic Wave resonator.

5. A radiofrequency transmitting device according to claim 1, wherein said radiofrequency reference oscillator outputs a reference signal having a fixed radiofrequency reference that the digital phase modulator is adapted to perform frequency translation and phase modulation such that the chosen radiofrequency is lower than the radiofrequency reference.

6. A radiofrequency transmitting device according to claim 1, wherein said RF reference oscillator outputs a reference signal having a fixed radiofrequency reference that is at least equal to said chosen radiofrequency.

7. A radiofrequency transmitting device according to claim 1, further compromising a division means for dividing the fixed radiofrequency reference of said reference signal by a chosen factor to feed said digital phase modulator with a reference signal having a chosen divided fixed radiofrequency reference for synthesizing said chosen radiofrequency.

8. A radiofrequency transmitting device according to claim 1, further comprising an amplitude modulator adapted to apply a chosen amplitude modulation to the output signal of the digital phase modulator such that the chosen amplitude modulation depends from the amplitude data portion of the input data.

9. A radiofrequency transmitting device according to claim 8, wherein said amplitude modulator comprises:
a digital-to-analog convertor for delivering analog amplitude data from said amplitude data; a low-pass filter for filtering said analog amplitude data to deliver filtered analog amplitude data defining an analog control signal; and a variable gain amplifier for applying an amplitude modulation defined by said analog control signal to said output signal.

10. A radiofrequency transmitting device according to claim 1, wherein said digital phase modulator comprises:
the delay-locked-loop, the delay-locked-loop comprising a cascade of N identical delay cells arranged for defining a chosen adjustable delay;
a feedback loop adapted to adjust the adjustable delay of the delay-locked-loop to one period of said phase data, in function of a control signal;
a phase selector for selecting the output of a selected delay cell of delay-locked-loop in order to apply the adjustable delay corresponding to said selected delay cell to said reference signal and then to produce said output signal; and
a control circuit adapted to select said selected delay cell in function of a digital control word representative of said chosen radiofrequency to be synthesized and of a chosen type of phase modulation, the control circuit comprising a delta-sigma modulator.

11. A radiofrequency transmitting device according to claim 10, wherein said feedback loop comprises:
a phase detector for comparing the phase of said reference signal with the phase of the signal outputted by the last delay cell of said Delay-Locked-Loop, in order to produce an error signal representative of the phase difference between said reference signal and said outputted signal; and
a low-pass filter for integrating the produced error signals to generate said control signal.

12. A radiofrequency transmitting device according to claim 10, wherein said control circuit comprises an accumulator or a digital delta-sigma modulator.

13. A radiofrequency transmitting device according to claim 1, wherein said radiofrequency transmitting device comprises communication equipment.

14. A radiofrequency transmitting device according to claim 1, wherein said radiofrequency transmitting device comprises an integrated circuit.

15. A method for delivering output signals having a chosen radiofrequency from input data split up into complementary phase data and amplitude data, the method comprising:
outputting a reference signal having a fixed radiofrequency reference to said chosen radiofrequency; and
synthesizing said chosen radiofrequency from said fixed radiofrequency reference by performing frequency translation and phase modulation of the fixed radiofrequency reference based on a number of N taps in a delay-locked-loop and a number of K taps that the reference signal is moved, as defined by the phase data, in the delay-locked-loop each cycle in order to produce an output signal having said chosen radiofrequency and phase modulation.

16. The method of claim 15 wherein outputting the reference signal comprises outputting a reference signal having a fixed radiofrequency reference that is lower than said chosen radiofrequency due to the performing of frequency translation and phase modulation.

17. The method of claim 15 wherein outputting a reference signal comprises outputting a fixed radiofrequency reference that is at least equal to said chosen radiofrequency.

18. The method of claim 15 further comprising dividing the fixed radiofrequency reference of said reference signal by a chosen factor.

19. The method of claim 15 further comprising applying a chosen amplitude modulation, depending from amplitude data representing partly said input data, to said output signal.

* * * * *